(12) United States Patent
Chen

(10) Patent No.: US 8,975,194 B2
(45) Date of Patent: Mar. 10, 2015

(54) METHOD FOR MANUFACTURING OXIDE LAYER

(71) Applicants: Peking University Founder Group Co., Ltd., Beijing (CN); Founder Microelectronics International Co., Ltd., Guangdong Province (CN)

(72) Inventor: Jinyuan Chen, Guangdong Province (CN)

(73) Assignees: Peking University Founder Group Co., Ltd. (CN); Founder Microelectronics International Co., Ltd. (CN)

(*) Notice: Subject to any disclaimer, the term of this patent is extended or adjusted under 35 U.S.C. 154(b) by 0 days.

(21) Appl. No.: 14/078,736

(22) Filed: Nov. 13, 2013

(65) Prior Publication Data

US 2014/0134850 A1 May 15, 2014

(30) Foreign Application Priority Data

Nov. 13, 2012 (CN) .......................... 2012 1 0455294

(51) Int. Cl.
*H01L 21/31* (2006.01)
*H01L 21/469* (2006.01)
*H01L 21/02* (2006.01)
*H01L 21/8238* (2006.01)

(52) U.S. Cl.
CPC .... *H01L 21/02233* (2013.01); *H01L 21/02255* (2013.01); *H01L 21/02323* (2013.01); *H01L 21/02332* (2013.01); *H01L 21/02337* (2013.01); *H01L 21/823878* (2013.01); *H01L 21/823892* (2013.01)
USPC ........... 438/765; 438/769; 438/770; 438/773; 257/E21.24

(58) Field of Classification Search
USPC ....................................................... 438/773
See application file for complete search history.

(56) References Cited

U.S. PATENT DOCUMENTS

| | | | | |
|---|---|---|---|---|
| 6,468,926 | B1 * | 10/2002 | Irino et al. | 438/773 |
| RE38,674 | E * | 12/2004 | Chau et al. | 438/773 |
| 2003/0022523 | A1 * | 1/2003 | Irino et al. | 438/769 |
| 2005/0158954 | A1 * | 7/2005 | Takahashi | 438/261 |

* cited by examiner

*Primary Examiner* — Angel Roman
(74) *Attorney, Agent, or Firm* — Renner, Otto, Boisselle & Sklar, LLP

(57) ABSTRACT

Disclosed a method for manufacturing an oxide layer, applicable to a manufacture procedure of a field oxide layer of a CMOS transistor in the field of semiconductor manufacturing, the method includes: injecting a first gas satisfying a first predetermined condition into a processing furnace in which a first CMOS transistor semi-finished product formed with an N-well and a P-well is placed, and dry-oxidizing the first CMOS transistor semi-finished product into a second CMOS transistor semi-finished product; and injecting a second gas satisfying a second predetermined condition different from the first predetermined condition into the processing furnace, and wet-oxidizing the second CMOS transistor semi-finished product into a third CMOS transistor semi-finished product.

6 Claims, 1 Drawing Sheet

Injecting a first gas satisfying a first predetermined condition into a processing furnace in which a first CMOS transistor semi-finished product formed with an N-well and a P-well is placed, and dry-oxidizing the first CMOS transistor semi-finished product into a second CMOS transistor semi-finished product — S101

Injecting a second gas satisfying a second predetermined condition different from the first predetermined condition into the processing furnace, and wet-oxidizing the second CMOS transistor semi-finished product into a third CMOS transistor semi-finished product — S102

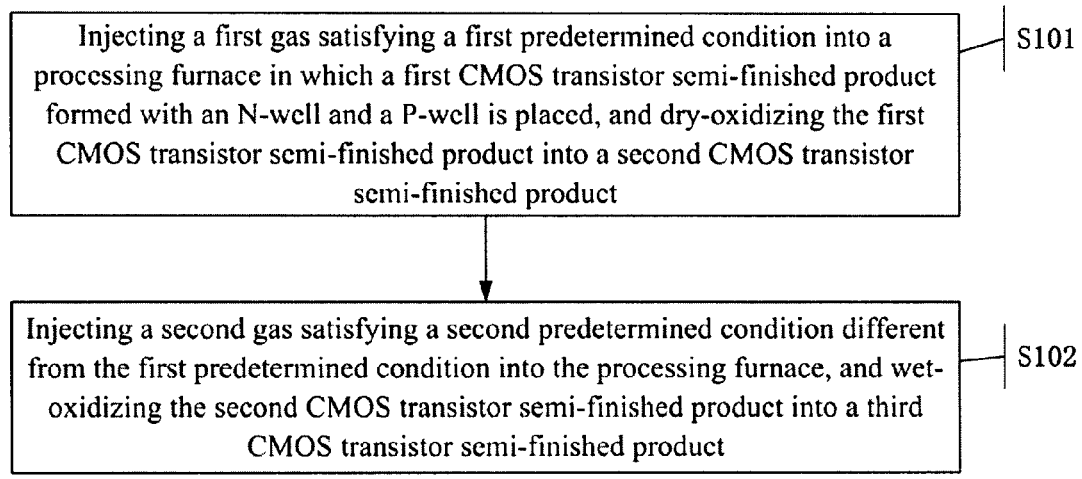

METHOD FOR MANUFACTURING OXIDE LAYER

FIELD OF THE INVENTION

The present application relates to the field of semiconductor manufacturing and particularly to a method for manufacturing an oxide layer.

BACKGROUND OF THE INVENTION

In the prior art, CMOS (Complementary Metal Oxide Semiconductor) transistors which are elementary electronic elements are commonly used in a variety of electronic products. A CMOS transistor is composed of two complementary MOS transistors including an NMOS transistor and a PMOS transistor. In order to manufacture the PMOS transistor, firstly N-type ions are implanted on a silicon substrate to form an N-well area, and then pattern layers of gate, source and drain are manufactured in the N-well area.

The resistance of the N-well is an important electrical parameter of the CMOS transistor, and the stability in a value of the resistance of the N-well is influenced directly by the concentration of the ions in the N-well area.

The two MOS transistors of the CMOS transistor are isolated from each other by a field oxide layer which is manufactured in a procedure divided into two steps of well driving-in and oxidation. In the prior art, in the procedure for manufacturing the field oxide layer, a thin oxide layer is formed through dry oxidation before the step of well driving-in.

However, the inventors have identified, during making of a technical solution in embodiments of the invention, at least the following technical problems in the prior art.

In the prior art, in the procedure for manufacturing the field oxide layer, the thin oxide layer is formed through dry oxidation. The thickness of the thin oxide layer is not sufficient to prevent effectively the N-well from being contaminated due to ions introduced thereto in the manufacture procedure.

In the prior art, poor stability or another abnormality of a device or a process in the manufacture procedure may cause ion contamination, where the ions remaining on the surface of the field oxide layer may penetrate the field oxide layer to be diffused into the well area below the field oxide layer, thus having the concentration of ions in the area changed and consequently the resistance of the N-well of the CMOS transistor changed and even exceeding a prescribed parameter, which may be greatly adverse to the reliability and the electrical stability of the product.

SUMMARY OF THE INVENTION

Embodiments of the application provide a method for manufacturing an oxide layer, which is applicable to a manufacture procedure of a field oxide layer, so as to address the technical problem in the prior art that the thin oxide layer formed through dry oxidation before the step of well driving-in is not sufficient in thickness to prevent effectively the N-well from being contaminated due to ions introduced thereto in the manufacture procedure, thereby achieving technical effects of preventing effectively the N-well from being contaminated due to the ions introduced thereto in the manufacture procedure and further stabilizing the concentration of ions in the N-well area and having the resistance of the N-well of the CMOS transistor stabilized within a prescribed range.

An embodiment of the application provides a method for manufacturing an oxide layer, the method including:

injecting a first gas satisfying a first predetermined condition into a processing furnace in which a first CMOS transistor semi-finished product formed with an N-well and a P-well is placed, and dry-oxidizing the first CMOS transistor semi-finished product into a second CMOS transistor semi-finished product, wherein a first oxide layer is formed between the N-well and the P-well of the second CMOS transistor semi-finished product in a first area in which a field oxide layer is to be formed; and injecting a second gas satisfying a second predetermined condition different from the first predetermined condition into the processing furnace, and wet-oxidizing the second CMOS transistor semi-finished product into a third CMOS transistor semi-finished product, wherein a second oxide layer which is an oxide layer formed by having the first oxide layer increased in thickness is formed in the first area of the third CMOS transistor semi-finished product.

Preferably, the first gas is oxygen gas or a mixture of oxygen gas and inert gas.

Preferably, the first predetermined condition is at reaction temperature of 900° C.±10° C.

Preferably, the second gas is a mixture of nitrogen gas, oxygen gas and hydrogen gas or a mixture of nitrogen gas and oxygen gas.

Preferably, the second predetermined condition is at reaction temperature of 900° C.±10° C.; and when the second gas is a mixture of nitrogen gas, oxygen gas and hydrogen gas, a gas flow ratio between the nitrogen gas, the oxygen gas and the hydrogen gas is 6:4:6, and when the second gas is a mixture of nitrogen gas and oxygen gas, a gas flow ratio between the nitrogen gas and the oxygen gas is 6:4.

Preferably, before injecting the first gas satisfying the first predetermined condition into the processing furnace in which the first CMOS transistor semi-finished product formed with the N-well and the P-well is placed, the method further includes:

injecting a third gas satisfying a third predetermined condition into the processing furnace to have the first CMOS transistor semi-finished product loaded, wherein the third gas is a mixture of nitrogen gas and oxygen gas, and the third predetermined condition is at reaction temperature of 700° C.±10° C. and a gas flow ratio 10:1 between the nitrogen gas and the oxygen gas.

One or more technical solutions according to the embodiments of the application have at least the following technical effects or advantages.

1. In the embodiments of the application, the step of wet oxidation is added following dry oxidation before the step of well driving-in in the manufacture procedure of the field oxide layer, to have the oxide layer increased in thickness, thus addressing effectively the technical problem in the prior art that the oxide layer in the first area formed through dry oxidation alone may not be sufficient in thickness to prevent effectively the N-well from being contaminated due to ions introduced thereto in the manufacture procedure, and further guaranteeing the pure ion doping in the N-well area.

2. In the embodiments of the application, the step of wet oxidation is added following dry oxidation, to have the oxide layer increased in thickness, thus preventing effectively ion impurities from being introduced to the N-well area in the manufacture procedure, and further stabilizing the concentration of ions in the N-well area and achieving the technical effect of having the resistance of the N-well of the CMOS transistor stabilized within a prescribed range.

3. In the embodiments of the application, only the step of wet oxidation is added over the prior art without any significant modification thereto, thus facilitating the implementation and the mass production of the products.

BRIEF DESCRIPTION OF THE DRAWINGS

FIG. 1 is a flow chart of a method for manufacturing an oxide layer according to an embodiment of the invention.

DETAILED DESCRIPTION OF THE EMBODIMENTS

Embodiments of the application provide a method for manufacturing an oxide layer, which is applicable to a manufacture procedure of a field oxide layer, so as to address the technical problem in the prior art that the thin oxide layer formed through dry oxidation before the step of well driving-in is not sufficient in thickness to prevent effectively the N-well from being contaminated due to ions introduced thereto in the manufacture procedure, thereby achieving technical effects of preventing effectively the N-well from being contaminated due to the ions introduced thereto in the manufacture procedure and further stabilizing the concentration of ions in the N-well area and having the resistance of the N-well of the CMOS transistor stabilized within a prescribed range.

A general idea of a technical solution of an embodiment of the invention is as follows.

Firstly, a first gas satisfying a first predetermined condition is injected into a processing furnace in which a first CMOS transistor semi-finished product formed with an N-well and a P-well is placed, and the first CMOS transistor semi-finished product is dry-oxidized into a second CMOS transistor semi-finished product, where a first oxide layer is formed between the N-well and the P-well of the second CMOS transistor semi-finished product in a first area in which a field oxide layer is to be formed.

Then, a second gas satisfying a second predetermined condition different from the first predetermined condition is injected into the processing furnace, and the second CMOS transistor semi-finished product is wet-oxidized into a third CMOS transistor semi-finished product, where a second oxide layer which is an oxide layer formed by having the first oxide layer increased in thickness is formed in the first area of the third CMOS transistor semi-finished product.

With the technical solution according to the embodiment of the application, this method is applicable to a procedure for manufacturing the field oxide layer, and simply the addition of the step of wet oxidation before the step of well driving-in in the prior art can prevent effectively the N-well from being contaminated by ions introduced thereto and further stabilize the concentration of ions in the N-well area and have the resistance of the N-well of a CMOS transistor stabilized within a prescribed range.

For better understanding of the foregoing technical solution, this technical solution will be described below in details with reference to the drawings and implementations thereof.

As illustrated in FIG. 1, in the step S101, the first gas satisfying the first predetermined condition is injected into the processing furnace in which the first CMOS transistor semi-finished product formed with the N-well and the P-well is placed, and the first CMOS transistor semi-finished product is dry-oxidized into the second CMOS transistor semi-finished product, where the first oxide layer is formed in the first area of the second CMOS transistor semi-finished product.

In an implementation, the first gas can be oxygen gas or a mixture of oxygen gas and inert gas.

The first predetermined condition can be at reaction temperature of 900° C.±10° C., e.g., 890° C., 900° C. or 910° C.

When the first gas is oxygen gas, a volume flow unit of the oxygen gas can be 10 liters per minute, and the oxygen gas can be at reaction temperature of 890° C. to 910° C. for a period of 4 to 6 minutes, to dry oxidize the first CMOS transistor semi-finished product.

When the first gas is the mixture of oxygen gas and inert gas, a volume flow unit of the oxygen gas can be 10 liters per minute, and a volume flow unit of the inert gas can be 10 liters per minute, and the mixture can be at reaction temperature of 890° C. to 910° C. for a period of 4 to 6 minutes, where the inert gas is typically helium gas or argon gas.

After the first CMOS transistor semi-finished product is dry-oxidized in the step S101, the first oxide layer with a thickness of 300 angstroms is formed in the first area of the first CMOS transistor semi-finished product, thus obtaining the second CMOS transistor semi-finished product, where the first oxide layer with the thickness of 300 angstroms is not sufficient to prevent effectively ion impurities from being introduced in the manufacture procedure.

After the second CMOS transistor semi-finished product with the first oxide layer is obtained in the step S101, the step S102 follows in which the second gas satisfying the second predetermined condition different from the first predetermined condition is injected into the processing furnace, and the second CMOS transistor semi-finished product is wet-oxidized into the third CMOS transistor semi-finished product, where the second oxide layer which is an oxide layer formed by having the first oxide layer increased in thickness is formed in the first area of the third CMOS transistor semi-finished product.

In an implementation, the second gas is a mixture of nitrogen gas, oxygen gas and hydrogen gas or a mixture of nitrogen gas and oxygen gas.

The second predetermined condition can be at reaction temperature of 900° C.±10° C., e.g., 890° C., 900° C. or 910° C.; and when the second gas is the mixture of nitrogen gas, oxygen gas and hydrogen gas, a gas flow ratio between the nitrogen gas, the oxygen gas and the hydrogen gas is 6:4:6, and when the second gas is the mixture of nitrogen gas and oxygen gas, a gas flow ratio between the nitrogen gas and the oxygen gas is 6:4.

When the second gas is the mixture of nitrogen gas, oxygen gas and hydrogen gas, a volume flow unit of the nitrogen gas can be 6 liters per minute, a volume flow unit of the oxygen gas can be 4 liters per minute, and a volume flow unit of the hydrogen gas can be 6 liters per minute, and the mixture can be at reaction temperature of 890° C. to 910° C. for a period of 40 to 50 minutes.

When the second gas is the mixture of nitrogen gas and oxygen gas, a volume flow unit of the nitrogen gas can be 6 liters per minute, and a volume flow unit of the oxygen gas can be 4 liters per minute, and the mixture can be at reaction temperature of 900° C.±10° C. for a period of 40 to 50 minutes.

After the second CMOS transistor semi-finished product is wet-oxidized in the step S102, the second oxide layer is formed in the first area of the second CMOS transistor semi-finished product, thus obtaining the third CMOS transistor semi-finished product, where the second oxide layer is an oxide layer formed by having the first oxide layer increased in thickness to 500 angstroms or more, and the second oxide layer with the thickness of 500 angstroms can prevent effectively ion impurities from being diffused to the N-well area and further stabilize the concentration of ions in the N-well area and thus have the resistance of the N-well of the CMOS transistor stabilized within a prescribed range.

In an implementation, the following scenarios are typically applicable to wet-oxidation.

In a first scenario, oxygen gas passing through highly pure water is injected into a furnace pipe, and here the oxidant includes both oxygen and water vapor.

In a second scenario, inert gas carrying water vapor is injected into a furnace pipe, and in this case oxidation results purely from the water vapor.

In a third scenario, pure hydrogen and pure oxygen are injected directly into a furnace pipe for reaction with each other into water vapor, which can have partial pressure of water molecules varied within a wide range and contamination lowered.

Of course, those ordinarily skilled in the art can make use of other alternatives in a practical application, and the embodiment of the invention will not be limited in terms of an implementation of wet oxidation.

In the method according to the embodiment of the application, before the step S101 in which the first gas satisfying the first predetermined condition is injected into the processing furnace in which the first CMOS transistor semi-finished product formed with the N-well and the P-well is placed, the method further includes:

a third gas satisfying a third predetermined condition is injected into the processing furnace to have the first CMOS transistor semi-finished product loaded, where the third gas is a mixture of nitrogen gas and oxygen gas, and the third predetermined condition is at reaction temperature of 700° C.±10° C. and a gas flow ratio 10:1 between the nitrogen gas and the oxygen gas.

In an implementation, a volume flow unit of the nitrogen gas can be 10 liters per minute, and a volume flow unit of the oxygen gas can be 1 liters per minute, and the mixture can be at reaction temperature of 690° C. to 710° C. for a period of 14 to 16 minutes to have the first CMOS transistor semi-finished product loaded.

After the step S102, in the procedure for manufacturing the field oxide layer of the CMOS transistor, the following steps are further included:

A mixture of nitrogen gas and oxygen gas is injected into the processing furnace, the mixture of nitrogen gas and oxygen gas is at reaction temperature of 700° C.±10° C., a gas flow ratio between the nitrogen gas and the oxygen gas is 10:1, and dry-oxidation is performed on the third CMOS transistor semi-finished product to obtain a fourth CMOS transistor semi-finished product;

Oxygen gas is injected into the processing furnace, and dry-oxidation is performed on the fourth CMOS transistor semi-finished product for the second time to obtain a fifth CMOS transistor semi-finished product; and A mixture of oxygen gas and hydrogen gas is injected into the processing furnace, and dry-oxidation is performed on the fifth CMOS transistor semi-finished product for the third time to manufacture the field oxide layer in the first area of the fifth CMOS transistor semi-finished product.

The technical solution according to the embodiments of the application has at least the following technical effects or advantages.

1. In the embodiments of the application, the step of wet oxidation is added following dry oxidation before the step of well driving-in in the manufacture procedure of the field oxide layer, to have the oxide layer increased in thickness, thus addressing effectively the technical problem in the prior art that the oxide layer in the first area formed through dry oxidation alone may not be sufficient in thickness to prevent effectively the N-well from being contaminated due to ions introduced thereto in the manufacture procedure, and further guaranteeing the pure ion doping in the N-well area.

2. In the embodiments of the application, the step of wet oxidation is added following dry oxidation, to have the oxide layer increased in thickness, thus preventing effectively ion impurities from being introduced to the N-well area in the manufacture procedure, and further stabilizing the concentration of ions in the N-well area and achieving the technical effect of having the resistance of the N-well of the CMOS transistor stabilized within a prescribed range.

3. In the embodiments of the application, only the step of wet oxidation is added over the prior art without any significant modification thereto, thus facilitating the implementation and the mass production of the products.

In this description, the invention has been described in connection with the particular embodiments thereof, but those skilled in the art can make various modifications and variations to the invention without departing the spirit and scope of the invention. Accordingly, the invention is also intended to encompass these modifications and variations thereto as long as the modifications and variations come into the scope of the claims appended to the invention and their equivalents.

The invention claimed is:

1. A method for manufacturing a field oxide layer, applicable to a manufacture procedure of a field oxide layer of a CMOS transistor, the method comprising:

injecting a first gas satisfying a first predetermined condition into a processing furnace in which a first CMOS transistor semi-finished product formed with an N-well and a P-well is placed, and dry-oxidizing the first CMOS transistor semi-finished product into a second CMOS transistor semi-finished product, wherein a first oxide layer is formed between the N-well and the P-well of the second CMOS transistor semi-finished product in a first area in which the field oxide layer is to be formed; and injecting a second gas satisfying a second predetermined condition different from the first predetermined condition into the processing furnace, and wet-oxidizing the second CMOS transistor semi-finished product into a third CMOS transistor semi-finished product, wherein a second oxide layer which is an oxide layer formed by having the first oxide layer increased in thickness is formed in the first area of the third CMOS transistor semi-finished product, and the second oxide layer is the field oxide layer for isolating two MOS transistors of the CMOS transistors.

2. The method according to claim 1, wherein the first gas is oxygen gas or a mixture of oxygen gas and inert gas.

3. The method according to claim 1, wherein the first predetermined condition is at reaction temperature of 900° C.±10° C.

4. The method according to claim 1, wherein the second gas is a mixture of nitrogen gas, oxygen gas and hydrogen gas or a mixture of nitrogen gas and oxygen gas.

5. The method according to claim 1, wherein the second predetermined condition is at reaction temperature of 900° C.±10° C.; and when the second gas is a mixture of nitrogen gas, oxygen gas and hydrogen gas, a gas flow ratio between the nitrogen gas, the oxygen gas and the hydrogen gas is 6:4:6, and when the second gas is a mixture of nitrogen gas and oxygen gas, a gas flow ratio between the nitrogen gas and the oxygen gas is 6:4.

6. The method according to claim 1, wherein before injecting the first gas satisfying the first predetermined condition into the processing furnace in which the first CMOS transistor semi-finished product formed with the N-well and the P-well is placed, the method further comprises:

injecting a third gas satisfying a third predetermined condition into the processing furnace to have the first CMOS transistor semi-finished product loaded, wherein the third gas is a mixture of nitrogen gas and oxygen gas, and the third predetermined condition is at reaction temperature of 700□±10□ and a gas flow ratio 10:1 between the nitrogen gas and the oxygen gas.

\* \* \* \* \*